United States Patent

Godefroid et al.

[11] Patent Number: 5,937,181
[45] Date of Patent: Aug. 10, 1999

[54] SIMULATION OF A PROCESS OF A CONCURRENT SYSTEM

[75] Inventors: Patrice Ismael Godefroid, Naperville, Ill.; Bernard Armand Boigelot, Angleur, Belgium

[73] Assignee: Lucent Technologies, Inc., Murray Hill, N.J.

[21] Appl. No.: 08/831,276

[22] Filed: Mar. 31, 1997

[51] Int. Cl.⁶ .................................. G06F 9/22; G06F 9/45
[52] U.S. Cl. ........................ 395/500; 395/670; 395/702; 395/709; 364/578; 364/468.05
[58] Field of Search .................. 364/488, 489, 364/490, 578, 468.05; 395/500, 680, 588, 670, 800.28, 702, 705, 708, 709

[56] References Cited

U.S. PATENT DOCUMENTS

| | | | |
|---|---|---|---|
| 5,163,016 | 11/1992 | Har'El et al. | 364/578 |
| 5,331,568 | 7/1994 | Pixley | 364/489 |
| 5,461,573 | 10/1995 | Chakradhar et al. | 364/489 |
| 5,465,216 | 11/1995 | Rotem et al. | 364/488 |
| 5,542,070 | 7/1996 | LeBlanc et al. | 395/500 |
| 5,594,656 | 1/1997 | Tamisier | 364/488 |
| 5,691,925 | 11/1997 | Hardin et al. | 364/578 |
| 5,740,084 | 4/1998 | Hardin et al. | 364/578 |

OTHER PUBLICATIONS

Ashar et al., "A Unified Approach to the Decomposition and Re–decomposition of Sequential Machines", IEEE, 1990, pp. 601–606.

Cabodi et al., Exploiting cofactoring for efficient FSM symbolic traversal based on the transition relation, IEEE, 1993, pp. 299–303.

Avedillo et al., "State Merging and State Splitting via State Assignment: A New FSM Synthesis Algorithm", IEEE, 1994, pp. 229–237.

Primary Examiner—Kevin J. Teska
Assistant Examiner—Thai Phan

[57] ABSTRACT

The simulation of sequences of the visible operations of a process in a concurrent system is performed by synthesizing the finite-state machine for the process from a projected tree. The synthesis procedure includes a parameter that can be adjusted to obtain machines that represent the desired behavior with varying degrees of approximation. An "on-the-fly" version of the invention provides intermediate results while the state space of the system continues to be explored. The finite-state machines may be abstracted to reduce the magnitude of visible operations to be considered to a more manageable level.

23 Claims, 6 Drawing Sheets

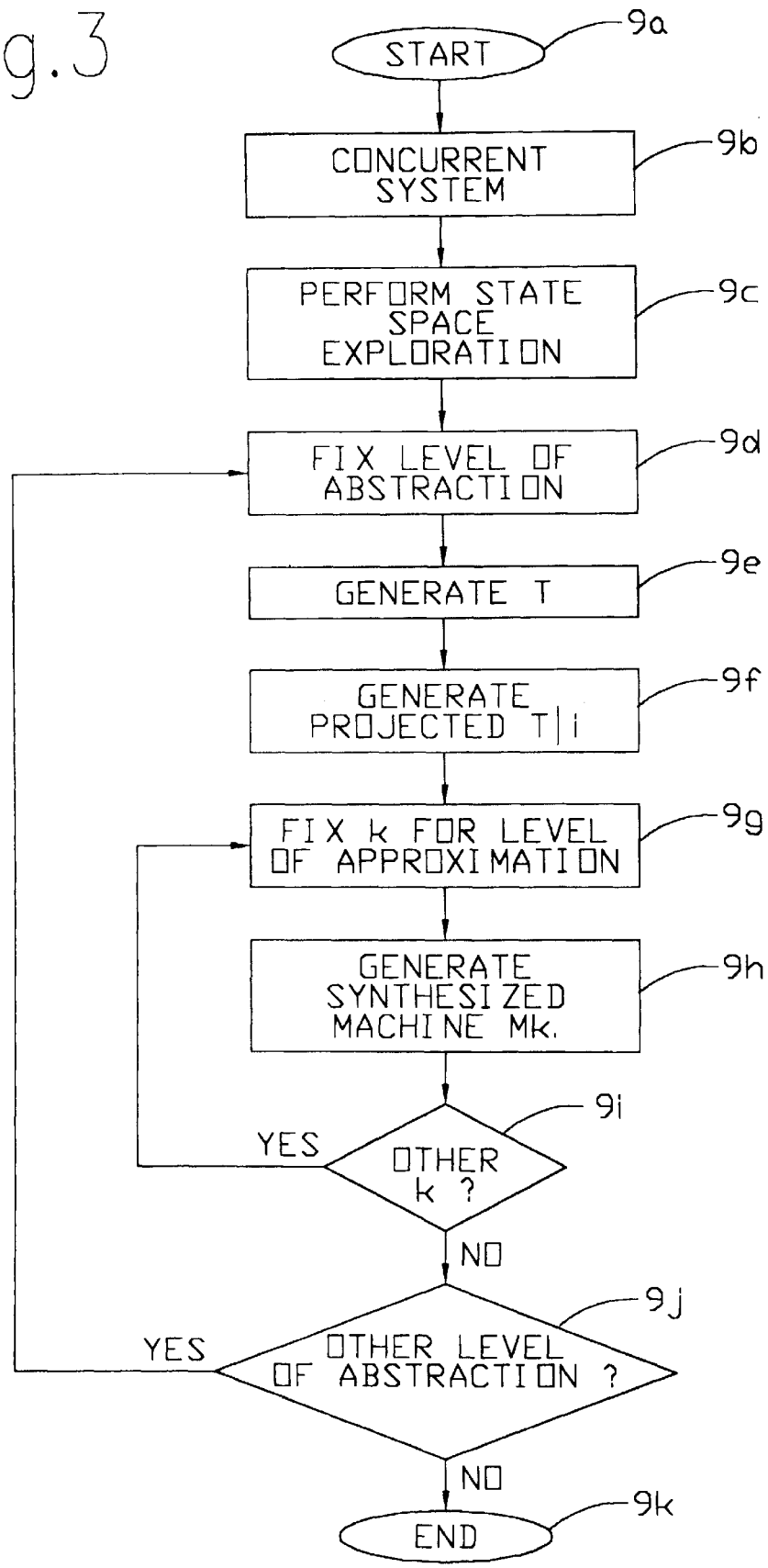

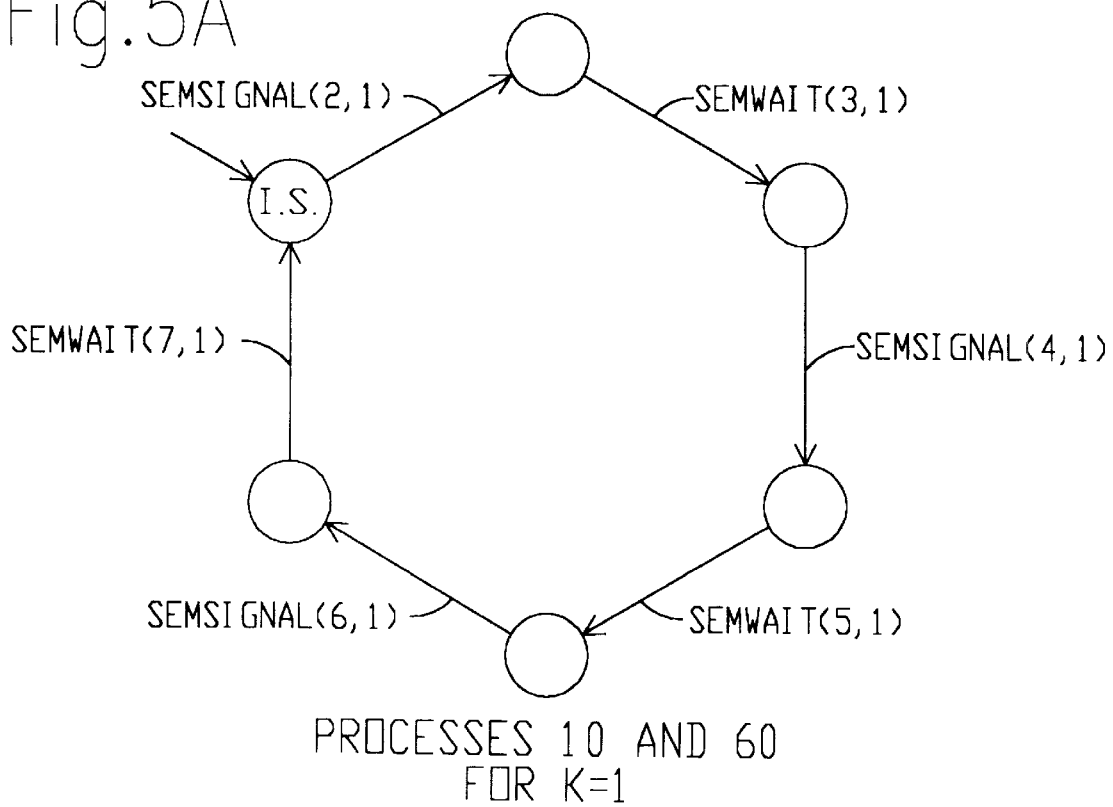
Fig.5A PROCESSES 10 AND 60 FOR K=1
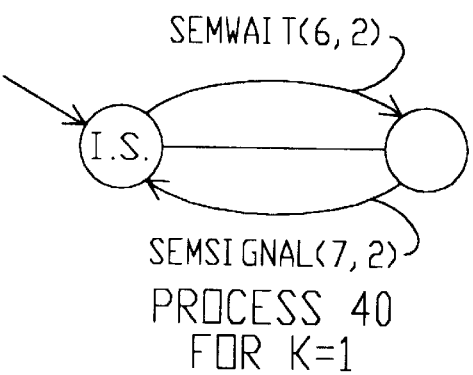
Fig.5B PROCESS 40 FOR K=1
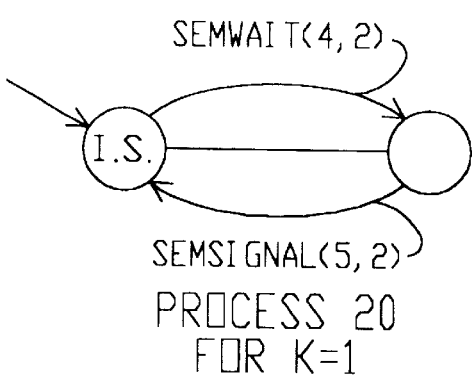
Fig.5C PROCESS 20 FOR K=1

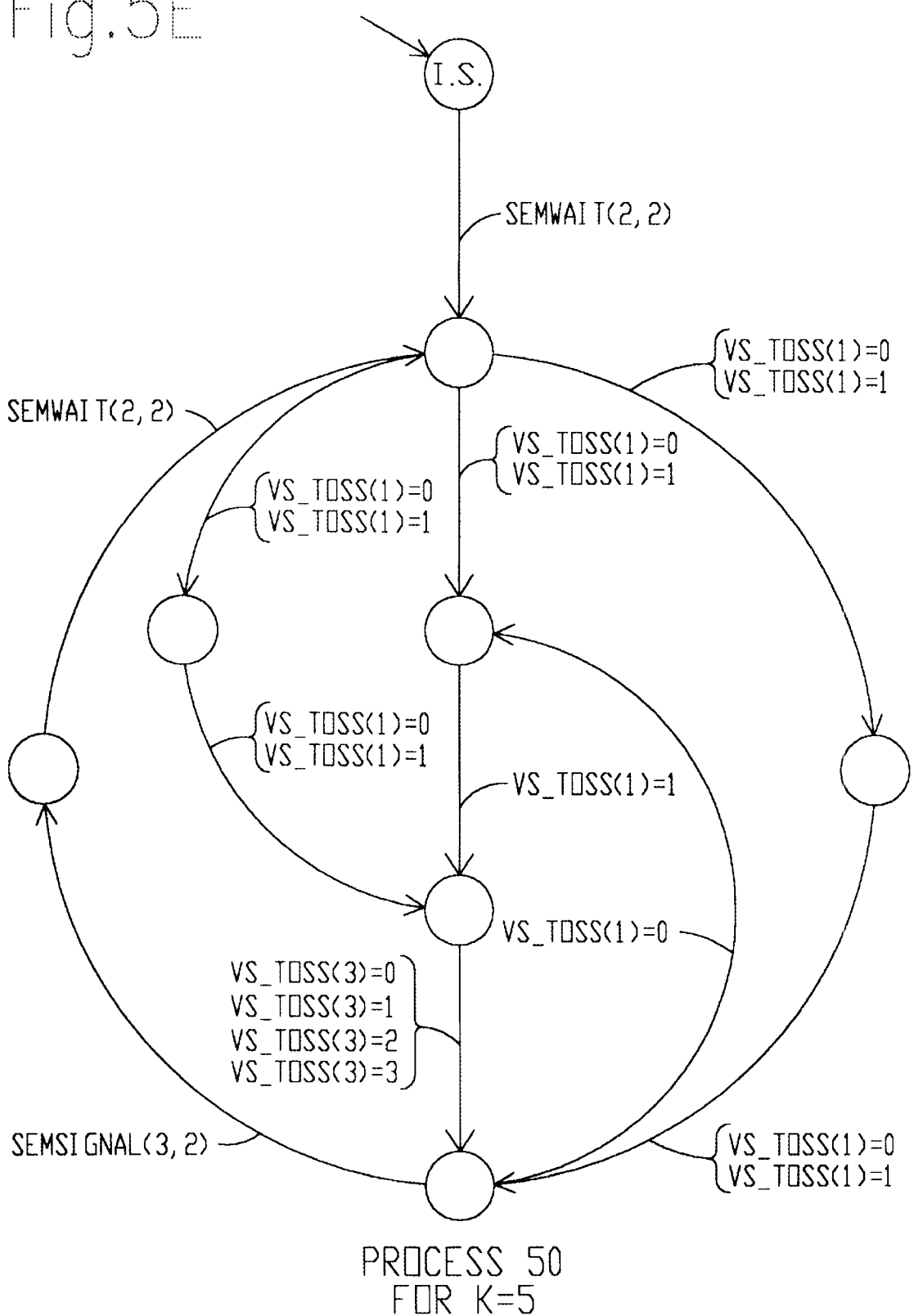

SIMULATION OF A PROCESS OF A CONCURRENT SYSTEM

TECHNICAL FIELD

This invention relates to the simulation of a process in a concurrent system.

BACKGROUND OF THE INVENTION

Tools exist that systematically explore the state spaces of systems composed of several concurrent processes executing C or C++ code to automatically detect problems between concurrent processes of a system. However, these tools only check specific formal properties. These specific formal properties do not use all the information available from the state space of a system and thereby fail to facilitate the best understanding of how the code is being exercised and how the different processes behave and interact with each other. This is because the state spaces of concurrent systems often contain millions of states and transitions which makes it difficult to extract the information and present it to the user in a meaningful and convenient way.

SUMMARY OF THE INVENTION

It has been determined that the state space of a software system contains much information that can be used to better understand how the code is being exercised and how the different processes interact with each other. This is done in the present invention by using all sequences of visible operations to determine how they contribute to the global behavior of the system in order to detect problems between concurrent systems. This abstracted information is then presented to the user in a useful format that is modifiable to a desired level of compactness to enable the user to visually evaluate the information.

Specifically, in accordance with the principles of the invention, the simulation of sequences of the visible operations of a process in a concurrent system is performed by synthesizing the finite-state machine for the process from a projected tree. A finite-state machine representing the observed behavior of a given process of the concurrent system being analyzed may be synthesized using a procedure which employs a parameter that specifies the level of fidelity of the resulting finite-state machine with respect to the observed behavior. Advantageously, the parameter can be adjusted so that various finite-state machines, each of which represents the observed behavior of the process with a different degree of fidelity, can be developed. Another aspect of the invention is an "on-the-fly" version of the invention for producing intermediate results while the state space of the system is still being explored. Yet another aspect of the invention provides an abstracted finite-state machines to reduce the magnitude of visible operations to be considered to a more manageable level.

BRIEF DESCRIPTION OF THE DRAWING

In the drawing:

FIG. 3 shows a flowchart of the synthesis procedure in accordance with the principles of the invention;

FIGS. 5(a)–(e) shows finite-state machines synthesized in accordance with the principles of the invention.

DETAILED DESCRIPTION

Systematic State Space Exploration

Figure 1A:
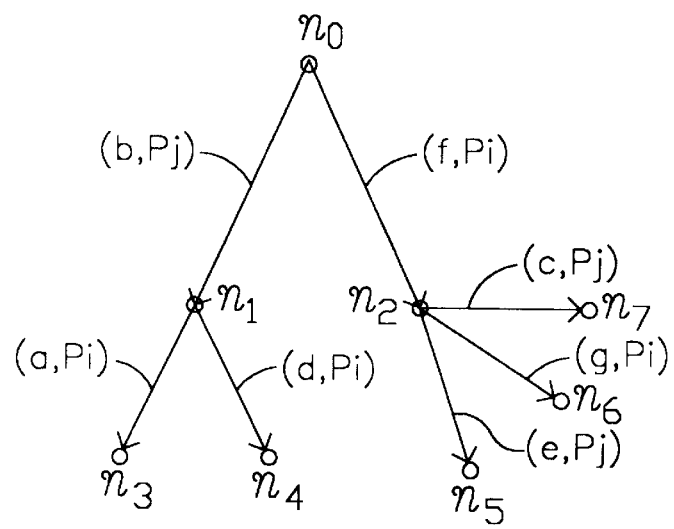
FIG. 1(a) shows a tree representing the state space of a concurrent system.

A concurrent system is composed of a finite set P of processes and a finite set of communication objects. Each process $P_i \in P$ executes a sequence of operations, described in a sequential program written in a full-fledged programming language such as C or C++. Such programs are deterministic which means that every execution of the program on the same input data performs the same sequence of operations. The processes communicate with each other by performing operations on communication objects. Examples of communication objects are shared variables, semaphores, and FIFO buffers. At any time, at most one operation is performed on a given communication object, and operations on the same communication object are mutually exclusive. Operations on communication objects are called visible operations, while other operations are called invisible. The execution of an operation is said to be blocking if its operation can not be completed and only executions of visible operations are assumed to be potentially blocking.

A concurrent system is in a global state when the next operation to be executed by every process in the system is a visible operation. It is assumed that every process in the system will always eventually attempt to execute a visible operation. Implicitly, after the creation of all the processes of the system, the system reaches a first and unique global state $s_0$, designated as the initial global state of the system.

A transition is defined as a visible operation followed by a finite sequence of invisible operations performed by a single process. A transition whose visible operation is blocking in a global state s is said to be disabled in s. Otherwise, the transition is said to be enabled in s. A transition t that is enabled in a global state s is executable from s. Once the execution of t from s is completed, the system reaches a global state s', called the successor of s by t. The state space of the concurrent system is composed of the global states that are reachable from the initial global state $s_0$, and of the transitions that are possible between the global states.

All operations on objects are deterministic, except one special operation "VS_toss". This operation takes as a parameter a positive integer n, and returns an integer in [0,n]. The operation is visible and non-deterministic so that the execution of a transition starting with VS_toss (n) yields up to n+1 different successor states corresponding to different values returned by VS_toss.

For further information of an example of a tool for systematically exploring the state space of a concurrent system as defined above reference is made to U.S. patent application No. 08/762,564 of Godefroid entitled *Protocol Checking for Concurrent Systems* filed Dec. 9, 1996, the disclosure of which is hereby incorporated by reference and which is assigned to the same assignee of this invention and not admitted to be prior art with respect to the present invention by its mention in this application.

Those of ordinary skill of the art will know how to create a labeled tree T representing the state space of a concurrent system representing the sequences of visible operations for processes in a concurrent system. In a tree in accordance with this invention, each node n of T corresponds to a global state of the system. Each edge (n,(a,$P_i$), n') of T corresponds to a transition in the state space from global state n to global state n', and is labeled by its visible operation "a" and by the identifier $P_i$ of the process executing the transition. The root node, $n_0$, of T corresponds to the initial global state $s_0$ of the system. Every path in T corresponds to a sequence of visible operations that have been observed during the state space exploration. If the state space search terminates, implicitly the state space of the system is finite and acyclic, and the final tree T generated contains all the sequences of visible operations that each individual process is able to perform in the concurrent system. FIG. 1(a) shows an illustration of tree T in which a, b, c, d, e, f, g are visible operations, $P_i$ and $P_j$ are processes, and $n_0$, $n_{1-7}$ are nodes. A tree could include many more edges and nodes. Of course, if the state space exploration is stopped before its completion, the final tree T obtained represents only the part of the state space that has been explored.

The following definitions and notations will be used in the following sections. A finite-state machine, is a tuple M=(S, A,Δ,$s_0$), where S is a finite set of states, A is an alphabet, Δ ⊆S×A×S is a transition relation, and $s_0$∈S is the initial state. A finite word w=$a_0 a_1 \ldots a_{n-1}$ is accepted by a finite-state machine M if there is a sequence of states σ=$s_0 \ldots s_n$ such that $s_0$ is the initial state of M and $(s_i, a_i, s_{i+1})$∈Δ for all 0≤i≤n−1. A labeled tree is viewed as a finite-state machine where (1) there is exactly one node, called the root, which no transitions enters, (2) every node except the root has exactly one entering transition, and (3) there is a path from the root to each state.

Definition 1. A finite-state machine $M_1=(S_1, A_1, \Delta_1, s_0^1)$ simulates a finite-state machine $M_2=(S_2, A_2, \Delta_2, s_0^2)$ if there exists a binary relation R⊆$S_1 \times S_2$ that satisfies the two following conditions:

1. $(s_0^1, s_0^2)$∈R;
2. whenever $(s_1,s_2)$∈R and $(s_2, a, s_2')$∈$\Delta_2$, there exists a $s_1'$ such that $(s_1,a, s_1')$∈$\Delta_1$ and $(s_1', s_2')$∈R.

Definition 2. Two finite-state machines $M_1=(S_1, A_1, \Delta_1, s_0^1)$ and $M2=(S_2, A_2, \Delta_2, s_0^2)$ are strongly bisimilar if there exists a binary relation R ⊆$S_1 \times S_2$ that satisfies the three following conditions:

1. $(s_0^1, s_0^2)$∈R;
2. whenever $(s_1,s_2)$∈R; and $(s_1, a, s_1')$∈$\Delta_1$, there exists a $s_2'$ such that $(s_2,a,s_2')$∈$\Delta_2$, and $(s_1',s_2')$∈R;
3. whenever $(s_1,s_2)$∈R; and $(s_2, a, s_2')$∈$\Delta_2$, there exists a $s_1'$ such that $(s_1, a, s_1')$∈$\Delta_1$ and $(s_1',s_2')$∈R.

Synthesis of the Finite-State Machine

Given a tree T representing the state space or a portion thereof of a concurrent system, it is desired to synthesize a finite-state machine M that simulates all the sequences of visible operations of process $P_i$∈P that were observed during the exploration of T.

Figure 1B:
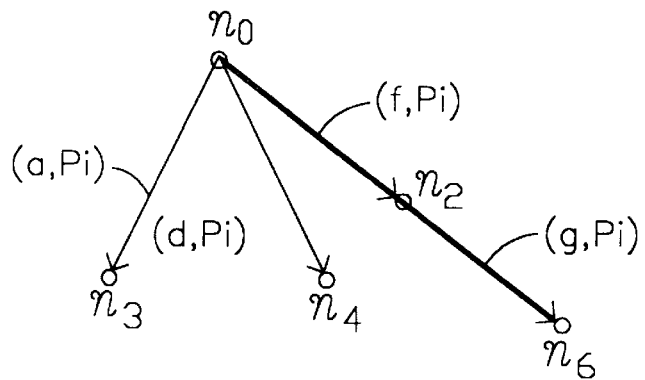
FIG. 1(b) shows a projected tree generated for a process in a concurrent system.

T typically contains transitions performed by all the processes of the system, and the projection of T is first computed on the set of operations executed by $P_i$. This is done by hiding in T all the edges e=(n, (a, $P_j$),n') corresponding to operations performed by processes other than $P_i$. For every such edge e, the origin of all the edges outgoing from the destination node n' of e is replaced by n, and the edge e is then discarded. The implementation of the process also ensures that the resulting tree is deterministic, that is all edges from a node have different labels. Moreover, the successor edges of each node are sorted. Let T|i denote the tree returned by the projection. T|i is called a projected tree. FIG. 1(b) depicts an illustration of a projected tree of the tree shown in FIG. 1(a).

For synthesizing a finite-state machine for process $P_i$ from T|i, a procedure is used to generate a finite-state machine for computing a given function f. Specifically, the procedure takes as input a finite set S of words on an alphabet A and a function f:A* |→Y that maps words in A* to values in set Y. Then a finite-state machine M is generated whose states are labeled by values in Y and such that the execution of M on any word w∈S leads to a state labeled by f(w). For further information concerning the generation of a finite-state machine for computing a given function, the reader is referred to *IEEE Transactions on Computers*, 21(6) :592–597, June 1972 by A. W. Biermann and J. A. Feldman, which is hereby incorporated by reference.

One feature in accordance with the principles of the invention is to define an equivalence relation between the nodes of the projected tree T|i, and to associate one state of the output finite-state machine to each equivalence class. Then, for every pair of nodes connected by an edge in the projected tree T/i, a transition with the same label is added in the synthesized finite-state machine to connect the two states corresponding to the equivalence classes of these nodes. The synthesis procedure includes a parameter for adjusting the finite-state machines to provide the desired behavior with varying degrees of approximation.

Let k be a positive integer and for each node n of the projected tree T|i, let subtree(n, k) denote the subtree of T|i that has n as its root and that contains all the successor edges and nodes of n up to depth k. This implies that all the paths in subtree (n, k) contain at most k edges.

Definition 3. Two nodes n and n' of the projected tree T|i are said to be k-equivalent if subtree (n, k) and subtree (n', k) are strongly bisimilar.

Since T|i is deterministic, all subtrees of T|i are also deterministic. Therefore, since the successor edges of each node in T|i are sorted by the projection procedure to check whether subtree (n, k) and subtree (n', k) are strongly bisimilar is done in time linearly proportional to the size of the smallest of both subtrees. Let $[n]_k$ denote the set of nodes of T|i that are k-equivalent to n.

The synthesized finite-state machine $M_k$ is defined as follows:

Definition 4. Given a projected tree T|i=(S,A,Δ,$s_0$) and an integer k>0, the nondeterministic finite-state machine $M_k$=$(S_k, A_k, \Delta_k, s_0^k)$, is defined by $S_k$={$[n]_k$|n∈S},
$A_k$=A,
$\Delta_k$⊆$S_k \times A_k \times S_k$ is such that
$([n]_k, a, [n']_k)$∈$\Delta_k$ iff∃(n, (a, $P_i$), n')∈Δ,
$s_0^k$=$[s_0]_k$.

This construction groups together the nodes of the projected tree T|i that are k-equivalent. If subtrees corresponding to nodes of $M_k$ that have already been generated are stored in a hash table, and assuming that it takes O(1) time, a constant interval of time, to access any of these trees, then the overall worst-case time complexity of the above procedure is on the order of $NB^k$ where N is the number of nodes in T|i and B is the maximum number of successor edges of a node in T|i.

According to a theorem let T|I=(S, A, Δ, $s_0$) be a projected tree, let k be a positive integer, and let $M_k$=$(S_k, A_k, \Delta_k, s_0^k)$ be the corresponding finite-state machine as defined in Definition 4. Then, $M_k$ simulates T|i.

Then according to a corollary, let L(T|i) denote the language accepted by the projected tree T|i, and let L($M_k$) be the language accepted by the finite-state machine $M_k$ as defined in Definition 4. Then, $L(T|i) \subseteq L(M_k)$.

The theorem formalizes the notion of an "approximation" provided by $M_k$ with respect to $T|i$. The level of approximation is determined by the parameter k. If k is small, the procedure groups together many different nodes of $T|i$, and hence generates a very compact machine. Conversely, if k is greater or equal to the depth $(T|i)$, the length of the longest path of sequence of operation in $T|i$, no approximation is made, and the resulting machine $M_k$ and $T|i$ are strongly bisimilar and accept the same language.

The previous observation implies that, for every $T|i$, there exists a k such that $L(T|i)=L(M_k)$. More interestingly, it also implies that, for every $T|i$, there exists a k such that Condition (1): $L(T|i)=\{w \in L(M_k):|w| \leq depth(T|i)\}$.

This property holds when, not only all the sequences of $T|i$ are represented in $M_k$, but also all the sequences of length smaller or equal to depth $(T|i)$ accepted by $M_k$, correspond to sequences of operations contained in $T|i$. The approximation performed by the synthesis procedure is then exact for sequences of operations whose length is limited to depth $(T|i)$. Given a projected tree $T|i$, it is possible to compute the smallest value of k that satisfies Condition (1) above. As will be explained, this value potentially is much smaller than the smallest value of k satisfying $L(T|i)=L(M_k)$.

Figure 2A:
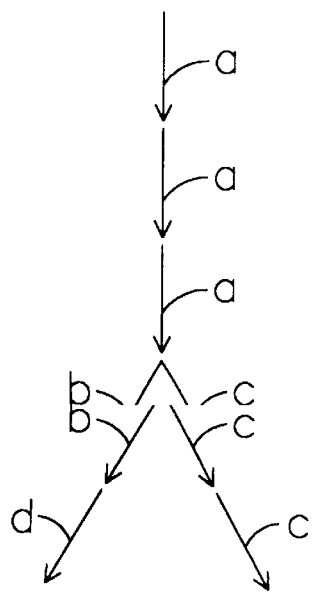
FIG. 2(a) shows a projected tree for a process.
Figure 2B:
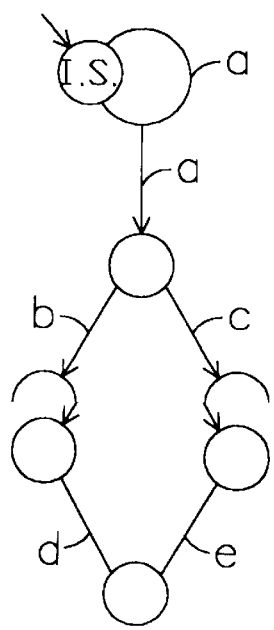
FIG. 2(b) shows a synthesized finite-state machine from the projected tree shown in FIG. 2(a)

FIG. 2(a) depicts a projected tree with a, b, c, d, e, representing visible operations and FIG. 2(b) depicts a synthesized finite-state machine with k=1. The finite-state machine in FIG. 2(b) is the synthesized finite-state machine generated by the above procedure with k=1. It is observed that nodes of the synthesized finite-state machine correspond to nodes of the projected tree that have the same k-subtree. Furthermore, the initial state, identified as I. S., of the finite-state machine is the equivalence class of states that have only one transition labeled by "a" as successor. Because the finite-state machine contains a cycle from the initial state in the finite-state machine, the language of the projected tree is not equal to the language of the machine. The minimum value of k such that $L(T|i)=L(M_k)$ for this example is 3. The minimum value of k satisfying Condition (1) is 3 as well. FIG. 3 is a flow chart representing the synthesis procedure applied to a concurrent system. The method starts at step 9a. At step 9b, a concurrent system is selected. At step 9c, a state space exploration is performed. At step 9d, the level of abstraction is fixed. At step 9e, the tree T is generated representing the state space of the concurrent system. A projected tree $T|i$ is then generated at step 9f. At step 9g, k is fixed for a level of approximation. At step 9h, a synthesized machine mk is generated. At 9i, it is determined if another level of approximation is desired. If yes, the method returns to step 9g. If not, the method returns to step 9j, and a determination is made if another level of abstraction is desired. If yes, the method returns to step 9d. If not, the method ends at step 9k.

According to an aspect of the invention, it is possible to generate parts of the machine $M_k$ while the state space of the system is still being explored. This on-the-fly version is useful for providing feedback to the user before completion of the search, resulting in an synthesized finite-state machine. To achieve this feature, let a node n of the projected tree $T|i$ be called complete once subtree (n, k) is completely known, that is, when all the paths from n in $T|i$ contain at least k transitions or are known to be complete because all the corresponding executions of the system are finite and have been completely explored. Whenever a complete node n is available in the projected tree, it is be passed to the synthesis procedure, which then tests whether subtree (n, k) has already been visited. If this is not the case, a new state $[n]_k$ and new transitions are immediately be generated in $M_k$. By extension, such a state $[n]_k$ in $M_k$ will also be called complete.

However, there are examples of concurrent systems for which this on-the-fly version of the synthesis procedure is not helpful because no complete nodes are generated before the search ends. For instance, consider two processes $P_1$ and $P_2$ that repeatedly perform a wait operation, enter a critical section, and then perform a signal operation. Assuming the value of the semaphore is initially 1, there is an execution of the system where $P_2$ loops forever while $P_1$ does not move, although $P_1$ is often able to proceed eventually. Because of this scenario, the root node of the projected tree $T|i$ will never be complete since there exists an execution of the system where the execution of the first operation of is $P_1$ continually postponed, preventing the k-subtree of the root node to be completely defined. This pathological case shows that the on-the-fly feature just described is mainly useful for concurrent systems without loosely-coupled processes.

Application of the Synthesis Procedure

Figure 4:
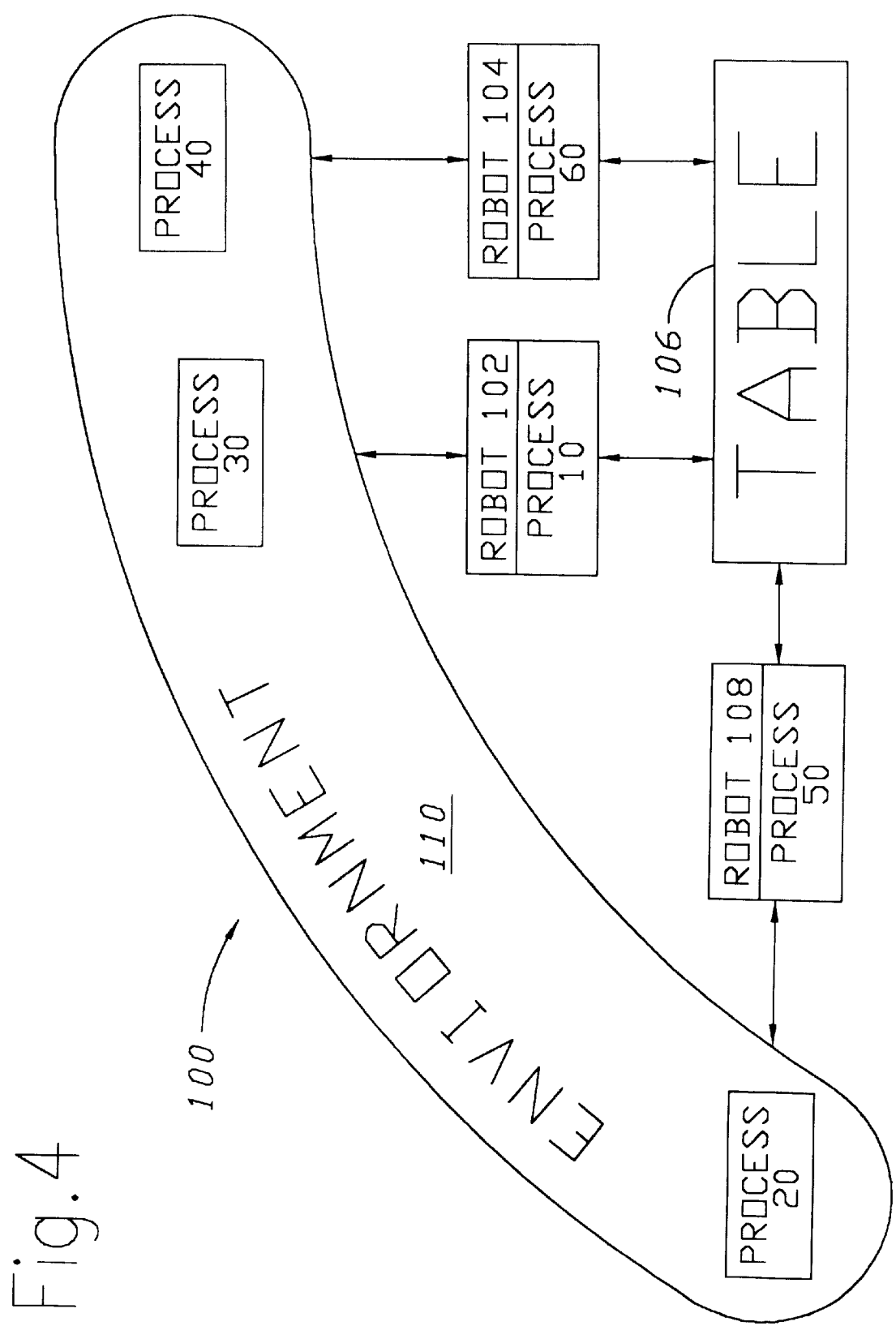
FIG. 4 is a block diagram of the robot system associated with the finite-state machine shown in FIGS. 5(a)–(e)

The synthesis procedure described in the previous section has been implemented in conjunction with a tool for systematically exploring state spaces of concurrent systems. Consider the results obtained with tests performed in accordance with the principles of the invention for a 2500-line concurrent C program controlling robots operating in an unpredictable environment. FIG. 4 shows a block diagram of the robot system including computer driven processes 10, 20, 30, 40, 50, and 60. More precisely, this program represents a concurrent system 100 composed of the six processes that communicate via shared memory and semaphores. Two of the processes 10 and 60 control robots 102 and 106, respectively, that collect objects randomly dropped on a table 106 by a third robot 108, represented by a third process 50. The three other processes 20, 30, and 40 are used to simulate the rest of an environment 110 of the robots 102, 104, and 108.

When the depth of the search is limited to 100 transitions, the tree representing the state space explored contained approximately 380,000 transitions, and is completely explored in approximately four hours on a "SparcStation 20." The tree is saved in a file of approximately 12 Megabytes. This tree was used as input for synthesis in the following experiments. All of the finite-state machines reported in what follows were generated in a few minutes of computation.

The finite-state machines synthesized with k=1 for the processes 10, 20, 40 and 60 are shown in FIGS. 5(a)–5(c). These processes synchronize with each other by executing the visible operations semsignal and semwait on semaphores that are identified by the first parameter of the operation. The second parameter specifies the value to be added (respectively subtracted) to the value of the corresponding semaphore after the execution of semsignal (respectively semwait). For all these processes, the minimum value of k satisfying Condition (1) is 1. Incomplete states are not shown. Increasing the value of k has little or no effect on the produced finite-state machines for these processes, as long as k is sufficiently smaller than the depth of the projected tree. When k reaches this threshold, the cycles in the graphs are unfolded and become sequences. The finite-state machines obtained for processes 10 and 60, which control the two robots 102 and 104 collecting objects on the table 106, are identical. The finite-state machine synthesized for process 30 does not contain any transitions.

Figure 5D:
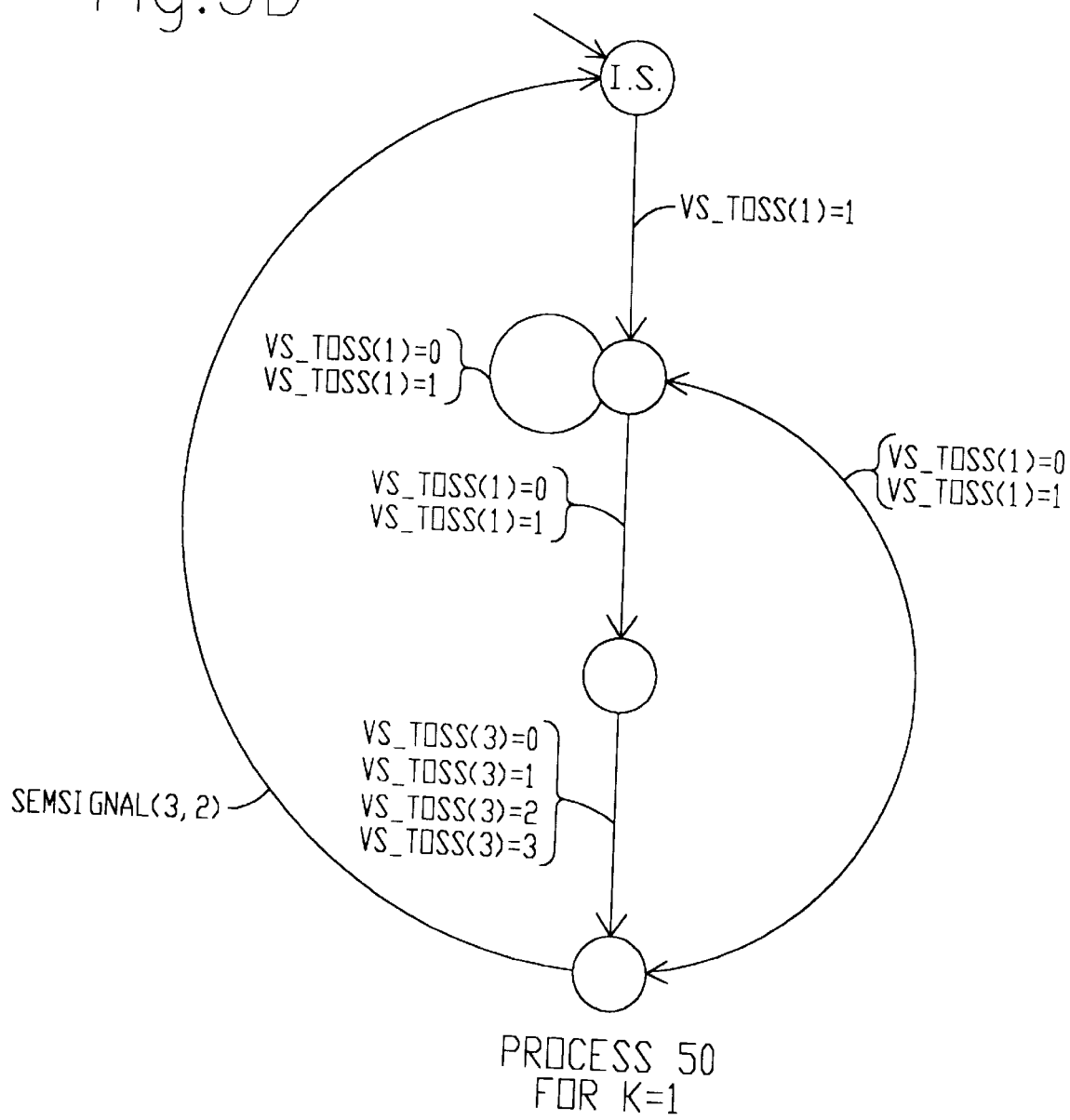

The finite-state machines generated for process 50 with k=1 is shown in FIG. 5(d) and with k=2 in FIG. 5(e). Process 50 is the process that periodically drops new objects on the table 106. It uses the visible operation VS_toss to randomly select locations on the table 106 for placing new objects. When the selected location is already occupied by another object, the process 50 attempts to find another location that is available. This procedure also involves calls to the visible operation VS_toss. The minimum value of k satisfying Condition (1) is 2. Choosing k=1 causes the synthesis procedure to consider the two successive occurrences of a same operation as executions of the same cycle of $M_1$ second state of $M_1$. This cycle generates sequences of operations that are not represented in T|i. Choosing k=2 yields the optimal machine that generates only sequences of T|i as described in the section of this application entitled "Synthesis of the Finite-State Machine". Greater values of k makes the synthesis procedure generate less compact machines.

Subsequently, information about the behavior of a system is obtained from the examination of the finite-state machines generated by the synthesis procedure. Information about the test coverage of the search performed by state space exploration is obtained from the finite-state machines since they contain the visible operations have been exercised during the search. For instance, the finite-state machine synthesized for process 30 in the previous example does not contain any transitions. This means that this process was never able to execute a visible operation during the scenarios represented in the explored part of the state space.

Since the synthesized finite-state machines represent partial descriptions of the individual processes of the system, they make it possible to discover properties of the behavior of these processes without formally specifying any property. Examining these machines is helpful in identifying suspicious and erroneous behaviors. This is also useful for selecting scenarios for testing purposes. For instance, unexpected behaviors in a finite-state machine assists in designing test cases to exhibit these behaviors. These scenarios are then executed and examined in detail at the implementation level with an interactive simulator.

The synthesized finite-state machines also provides valuable information about the overall communication and synchronization structure of the concurrent system. For the example of the previous section, it is observed from the synthesized finite-state machines that the coupling between the different processes is very tight: processes 10 and 60 enforce a strict synchronization ordering between processes 20, 40 and 50. The amount of parallelism in the system is very limited. This also reveals a potential weakness in the design of the synchronization structure of this system: a failure or death of one process should quickly block all the other processes of the system.

The synthesis procedure provides information on the regularity of the state space of the system. Indeed, the synthesis procedure detects recurrent patterns of operations in the observed, finite behaviors, and groups them in the generated finite-state machines. Extrapolating repetitive behaviors is helpful in predicting the very long or even infinite behaviors exhibited in the unexplored parts of the state space.

Finally, the synthesis procedure is a very effective way to present a huge amount of data such as, 12 Megabytes of data for example, on a complex concurrent program, 2500 lines of C code spread over twelve files, in a very compact form, a few tens of states and transitions, that are easily be examined by the user. When the generated finite-state machines are too large to be examined, which is a frequent occurrence, the user has the possibility to compute machines with a desired level of abstraction by modifying the labels corresponding to visible operations to obtain the desired level of detail. For instance, labels of operations that contain values of parameters such as a message being sent or received, is simplified by masking out the values of some of these parameters from the label name. This reduces the number of possible labels for the transitions and the application of the synthesis procedure results in an abstract finite-state machine because of the reduced number of transitions and visual operations considered.

In accordance with the principles of the invention, an embodiment has been presented for automatically synthesizing a finite-state machine that simulates all the sequences of visible operations of a given process, executing arbitrary C or C++ code that were observed during a state space exploration. The level of approximation is adjusted by modifying the value of the parameter k of the synthesis procedure. The level of abstraction is determined by controlling the set of labels of the transitions and visual operations prior to generating the T/i and the finite-state machine. Accordingly, it possible to discover the behavior of processes for which the code is unknown or unavailable, or to visually detect anomalies in the dynamic behavior of processes in their environment.

The synthesis procedure generates very compact and faithful finite-state machines from a huge amount of data. For the example previously considered regarding the program controlling robots, a handful of small finite-state machines satisfying Condition (1) were obtained from a state space tree of about 380,000 transitions. Preferably in accordance with the principles of the invention, it is used in conjunction with a tool for systematically exploring the state space of a concurrent system. If the synthesis procedure is used in conjunction with traditional testing and debugging tools for distributed and parallel programs familiar to those with ordinary skill in the art, the synthesized machines are likely to be much less compact. Indeed, since these tools explore random paths in the state space, a same local state of a process potentially is associated with different k-subtrees each time it is visited, and hence is represented by several states (equivalence classes) in the synthesized machine.

This work also proposes an original approach to reverse engineering. Indeed, traditional reverse engineering methods and tools are based on static analysis techniques for extracting information about the structure of complex programs. In contrast, the invention does not rely on any specific assumption about the static structure of the programs used to represent the behavior of the processes, which are written in any language. Moreover, it is also applicable to processes for which no code is available. Finally, it makes possible a much closer examination of the behavior of a process because it is based on the dynamic observation of its executions.

The foregoing merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method to simulate a process in a concurrent system having a state space, the method comprising the steps of:

generating a projected tree T|i representing at least a portion of the state space of the concurrent system; and synthesizing a finite-state machine having a correlative relationship to the projected tree T|i to simulate sequences of visible operations of the process.

2. The invention as defined in claim 1 wherein the finite-state machine has two states and further comprising the steps of:

identifying each pair of nodes which are connected by an edge of the projected tree T|i as an equivalence class;

associating one state of the finite-state machine to each equivalence class for every pair of nodes connected by an edge in the projected tree T|i; and adding a transition to the finite-state machine to connect the two states of the finite-state machine corresponding to the equivalence classes.

3. The invention defined in claim 1 further comprising the steps of:

associating a language with the projected tree T|i; and specifying the correlative relationship between the finite-state machine and the projected tree T|i by selecting the language of the projected tree T|i accepted by the finite-state machine.

4. The invention as defined in claim 1 further comprising the step of defining the projected tree T|i as corresponding to a set of sequences of visible operations for the process observed during a state space exploration of the concurrent system.

5. The invention as defined in claim 1 further comprising the step of defining a depth of the tree T|i as the longest path of sequences of visible operations connecting nodes and edges in the tree T|i.

6. The invention as defined in claim 5 further comprising the step of representing with the finite-state machine of all sequences of visible operations in the tree T|i when the language accepted for generating the finite-state machine is less than or equal to the depth of the tree T|i.

7. A method to simulate a process in a concurrent system having a state space, the method comprising the steps of:

generating a projected tree T|i representing at least a portion of the state space of the concurrent system, said projected tree T|i defining a language;

defining the projected tree T|i as corresponding to a set sequence of visible operations for the process;

defining a depth of the projected tree T|i as the longest path of sequences of visible operations connecting nodes and edges of the tree projected T|i; and synthesizing a finite-state machine accepting the language defined by the projected tree T|i to simulate sequences of visible operations of the process.

8. The invention as defined in claim 7 further comprising the step of designating a parameter to define a level of approximation by the finite-state machine for the set of sequences of visible operations of the tree T|i.

9. The invention as defined in claim 8 further comprising the steps of:

defining the approximation parameter as a positive integer k;

generating, for each node of the projected tree T|i, a subtree (n,k) of projected tree T|i having n as its root and containing all successor edges and nodes of n up to a depth of k, all paths in subtree (n,k) contain at most k edges;

defining a node n of the projected tree T|i as complete once the subtree (n,k) is completely known;

determining whether the subtree(n,k) has been visited; and synthesizing a state of a finite-state machine when a complete node is available in the projected tree T|i and the subtree(n,k) has been visited.

10. The invention as defined in claim 9 further comprising the step of visiting the subtree (n,k) when the subtree (n,k) has not been visited before synthesizing the finite-state machine.

11. The invention as defined in claim 8 further comprising the steps of:

defining the approximation parameter as a positive integer k, there existing a minimum value of k for which the language accepted by the finite-state machine is equal to or less than the depth of the projected tree T|i to cause all sequences of the projected tree T|i to be represented in the finite-state machine; and defining the language of the projected tree T|i as not being equal to the language of the finite-state machine for values greater than the minimum value of k, the representation by the finite-state of the sequences of the visible operations being included in the projected tree T|i as an approximation.

12. The invention as defined in claim 11 further comprising the step of cycling sequences of visible operations in the finite-state machine for values of k greater than the minimum value.

13. The invention as defined in claim 7 further comprising the step of:

abstracting the quantity of visible operations directed to the projected tree T|i and correspondingly reducing the transitions of the finite-state machine to provide a selected level of detail.

14. A method to simulate a selected one of a plurality of processes in a concurrent system having a state space and a plurality of processes with each process having sequences of visible operations observable during a state space exploration, the method comprising the steps of:

generating a tree T representing at least a portion of the state space of the concurrent system; and generating a projected tree T|i from tree T to express only the visible operations of the selected process.

15. The invention as defined in claim 14 further comprising the steps of:

synthesizing a finite-state machine; and displaying sequences of visible operations of projected tree T|i.

16. An apparatus for use in simulating a process in a concurrent system having a state space, the apparatus comprising:

means for generating a projected tree T|i representing at least a portion of the state space of the concurrent system; and means for synthesizing a finite-state machine having a correlative relationship to the projected tree T|i to simulate sequences of visible operations of the process.

17. The apparatus as defined in claim 16 wherein:

the finite-state machine has two states, and further comprising:

means of identifying each pair of nodes which are connected by an edge of the projected tree T|i as an equivalence class;

means for associating one state of the finite-state machine with each equivalent class for every class of nodes connected by an edge in the projected tree T|i; and means for adding a transition added to the finite-state machine to connect the two states of the finite-state machine corresponding to the equivalence classes.

18. The invention as claimed in claim 17 wherein the transition added by said adding means has a label equivalent to the edge in the projected tree T|i.

19. The invention as claimed in claim 16 wherein the synthesizing means provides a display of all sequences of visible operations in the projected tree T|i .

20. The invention as claimed in claim 16 wherein the synthesizing means provides a display of an approximation of the sequences of visible operations the in projected tree T|i.

21. The invention as claimed in claim 20 wherein the display includes cycles of sequences of visible operations.

22. An apparatus for simulating a selected one of a plurality of processes of a concurrent system having a state space, the apparatus comprising:

means for generating a tree T representing at least a portion of the state space of the concurrent system;

means for generating a projected tree T|i expressing only the sequences of visible operations of the selected process of the tree T;

means for synthesizing a finite-state machine to simulate the sequences of the visible operations in projected tree T|i; and means for producing a graphical display of the finite-state machine.

23. The invention as claimed in claim 22, wherein the means for synthesizing includes means for approximating the sequence of visible operations in the projected tree T|i displayed in the finite-state machine.

* * * * *